United States Patent [19]
So

[11] Patent Number: 6,136,666
[45] Date of Patent: Oct. 24, 2000

[54] METHOD FOR FABRICATING SILICON-ON-INSULATOR WAFER

[75] Inventor: Sang Mun So, Ich'on, Rep. of Korea

[73] Assignee: Hyundai Electronics Industries Co., Ltd., Kyoungki-do, Rep. of Korea

[21] Appl. No.: 09/223,601

[22] Filed: Dec. 30, 1998

[30] Foreign Application Priority Data

Jun. 30, 1998 [KR] Rep. of Korea ............ 98-25283

[51] Int. Cl.⁷ .................. H01L 21/30; H01L 21/46
[52] U.S. Cl. .................. 438/458; 438/455; 438/459; 438/928; 438/967; 438/977
[58] Field of Search .................. 438/455, 458, 438/459, 428, 467, 977

[56] References Cited

U.S. PATENT DOCUMENTS

| | | | |
|---|---|---|---|
| 4,601,779 | 7/1986 | Abernathey et al. | 156/628 |
| 4,826,787 | 5/1989 | Muto et al. | 437/208 |
| 5,449,638 | 9/1995 | Hong et al. | 437/61 |
| 5,523,254 | 6/1996 | Satoh et al. | 437/62 |
| 6,010,950 | 1/2000 | Okumura et al. | 438/455 |

FOREIGN PATENT DOCUMENTS

| | | | |
|---|---|---|---|
| 07049281 | 2/1995 | Japan | G01L 13/06 |
| 09064317 | 3/1997 | Japan | H01L 27/12 |
| 10079498 | 3/1998 | Japan | H01L 27/12 |

*Primary Examiner*—John F. Niebling
*Assistant Examiner*—David A Zarneke
*Attorney, Agent, or Firm*—Ladas & Parry

[57] ABSTRACT

Disclosed is a method for fabricating a silicon-on-insulator wafer, particularly to a cost reductive method.

20 Claims, 6 Drawing Sheets

METHOD FOR FABRICATING SILICON-ON-INSULATOR WAFER

BACKGROUND OF THE INVENTION

1. Field of the Invention

The present invention relates to a method for fabricating a silicon-on-insulator wafer, particularly to a cost reductive method.

2. Description of the Related Art

According to recent developments in semiconductor fabrication technology to high integrity and fast operation, the semiconductor integration technology employing a silicon-on-insulator wafer, hereinafter "SOI" wafer, instead of employing bulk silicon wafer has been remarkably reported. SOI wafer generally includes a first silicon substrate for supporting the entire structure, a second silicon substrate in which a device are formed and a buried oxide film interposed therebetween are formed. The semiconductor device integrated on the SOI wafer as described above, enables a complete device isolation, a reduction of parasitic capacitance and a fast operation.

The SIMOX (separation by implanted oxygen) method using oxygen ion implantation and bonding method bonding two silicon substrates are frequently used as conventional method for fabricating SOI wafer. In the SIMOX method, oxygen ions are injected into a bulk silicon wafer, and then the oxygen ions and the silicon ions are reacted each other thereby forming a buried oxide film in a selected depth of the wafer so as to isolate the wafer. In the bonding method, an oxide film is formed on one substrate of a first silicon substrate and a second silicon substrate, and then two substrates are bonded each other with sandwiching the oxide film and next, an expected thickness of the second silicon substrate is left behind by polishing the second silicon substrate where a device is to be formed.

However, the SIMOX method for fabricating an SOI wafer carried out by the oxygen ion implantation has disadvantage in that the oxygen ions may cause a crystalline defection of silicon layer and it is difficult to adjust thickness of the silicon layer. Furthermore, this method requires longer fabrication time. Therefore recently the bonding method bonding two substrates is frequently used.

FIGS. 1A to 1D are cross-sectional views for showing a conventional method for fabricating SOI wafer.

Referring to FIG. 1A, a first silicon substrate 10 being comprised of bulk silicon is provided. A first oxide film 11 is formed on the first silicon substrate 10 by a thermal oxidation process.

Referring to FIG. 1B, a second silicon substrate 20 being comprised of bulk silicon is provided. A field oxide film 21 is formed on the second silicon substrate 20 by LOCOS. A second oxide film 22 is deposited on the second silicon substrate 21 in which the field oxide film 21 is formed.

Referring to FIG. 1C, the first silicon substrate 10 and the second silicon substrate 20 are bonded such that first oxide film 11 and the second oxide film 22 are in contact with each other respectively, and are heat-treated so that a selected degree of bonding intensity is given thereto. Referring to FIG. 1D, the backside of the second silicon substrate 20 is polished so that a required thickness of silicon layer is left behind.

This SOI wafer fabricated according to the above processes can be made with ease. Nevertheless, high fabrication cost is the shortcoming of this type of SOI wafer since one SOI wafer is made out of two silicon substrates.

SUMMARY OF THE INVENTION

So as to solve the above described problem, the present invention provides a method for fabricating a silicon-on-insulator wafer with cost reduction.

According to an aspect of the present invention, there is provided to a method for fabricating silicon-on-insulator wafer, comprising the steps of: providing a first, a second and a third silicon substrates being comprised of bulk silicon; forming a first oxide film on one side of the first silicon substrate; forming a first impurity layer within the second silicon substrate with a selected depth; forming an isolation film in one side of the second silicon substrate; forming a second oxide film having even surface on the second silicon substrate; bonding the second oxide film of the second silicon substrate and the first oxide film of the first silicon substrate; performing a first polishing, a wet-etching and a second polishing processes in sequence until the impurity layer is removed, in the other side of the second silicon substrate; forming a second impurity layer within the second silicon substrate adjoining the first isolation film; forming a second isolation film in the other side of the second silicon substrate; forming a third oxide film having even surface on the other side of the second silicon substrate; forming a fourth oxide film on the third silicon substrate; bonding a fourth oxide film of the third silicon substrate and the third oxide film of the second silicon substrate; dividing a first wafer and a second wafer by the second impurity layer as a boundary line, wherein the first wafer includes the first isolation film and a first silicon layer which is some portion of the second silicon substrate where the first isolation film is formed, and the second wafer includes the second isolation film and a second silicon layer which is some portion of the second silicon substrate where the second isolation film is formed; and polishing the first and the second silicon layers using the first and the second isolation films of the first wafer and the second wafer as a polishing stopper, respectively.

DETAILED DESCRIPTION OF THE INVENTION

FIGS. 2A to 2I are cross-sectional views for showing a method for fabricating SOI wafer according to the embodiment of the present invention.

Figure 1A:
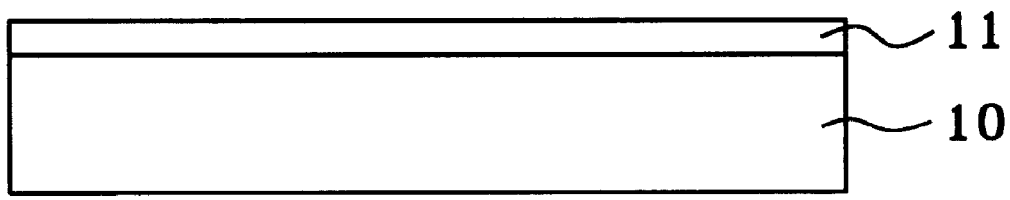
FIGS. 1A to 1D are cross-sectional views for showing a conventional method for fabricating a SOI wafer.
Figure 1B:
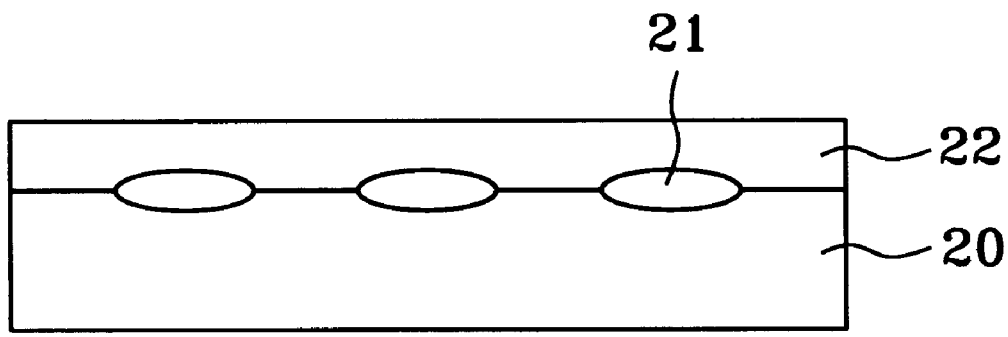
Figure 1C:
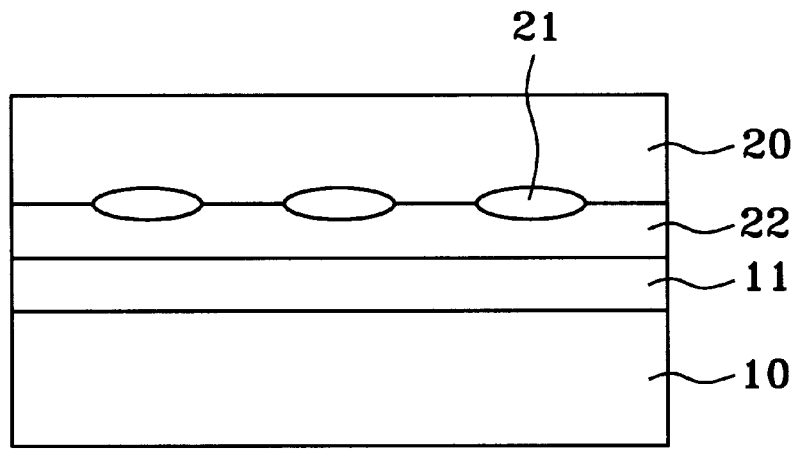
Figure 1D:
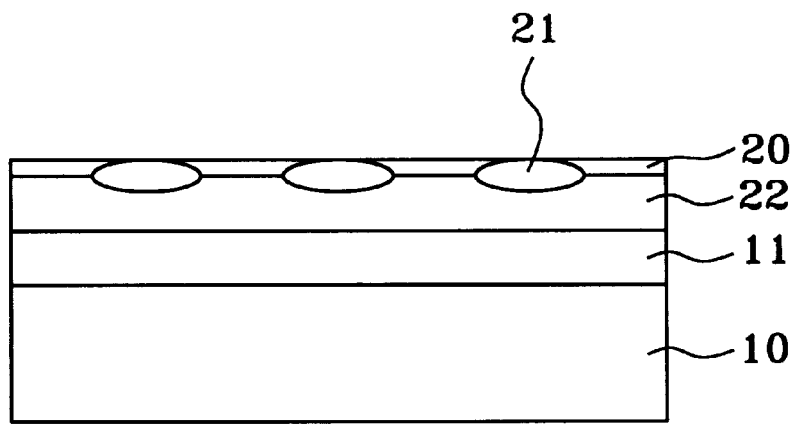
Figure 2A:
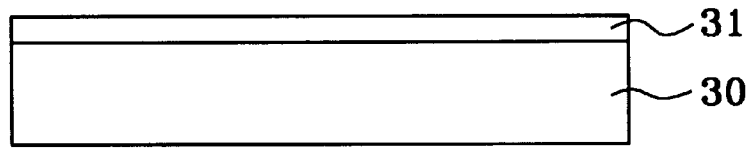
FIGS. 2A to 2I are cross-sectional views for showing a method for fabricating SOI wafer according to an embodiment of the present invention.

Referring to FIG. 2A, a first silicon substrate 30 for supporting the entire structure is provided. A first oxide film 31 with thickness of 500~1,000 Å is formed on one side of the first silicon substrate 30 by a thermal oxidation process. The first oxide film 31 is a thermal oxide film grown by the thermal oxidation process. Instead of using the thermal oxide film 31, a CVD oxide film can be deposited on the first silicon substrate 30 wherein the CVD oxide film is selected from BPSG film, SOG film, $O_3$-TEOS oxide film and high density plasma oxide film.

Figure 2B:
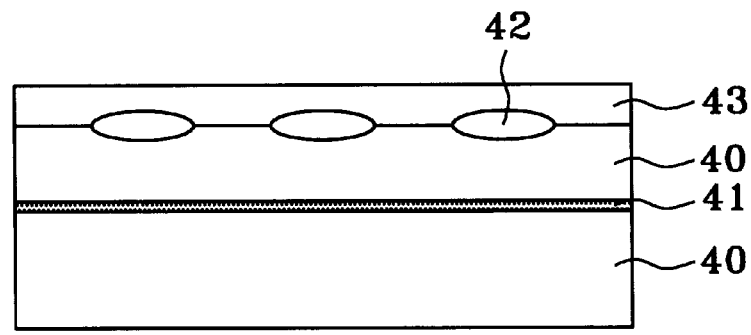

Referring to FIG. 2B, a second silicon substrate 40 is provided and a first boron ion implantation layer 41 is formed in a selected depth within the second silicon substrate 40 by injecting boron ions with energy of 50~200 KeV and dose of $1.0 \times 10^{15}/cm^2 \sim 3.0 \times 10^{16}/cm^2$. The first ion implantation layer 41 acting as etching stopper will be described later on. The first ion implantation layer also maintains thickness of the second silicon substrate 40.

According to the partial oxidation process what is called a LOCOS method, a first field oxide film 42 with thickness of 500~5,000 Å is formed in the second silicon substrate 40. The first field oxide film 42 is formed not to contact with the boron ion layer 41. A second oxide film 43 having even surface is formed with thickness of 1,000~10,000 Å on the one side of the second silicon substrate 40. The second oxide film 43 is a CVD oxide film selected from BPSG film, SOG film, $O_3$-TEOS oxide film and high density plasma oxide film.

Figure 2C:
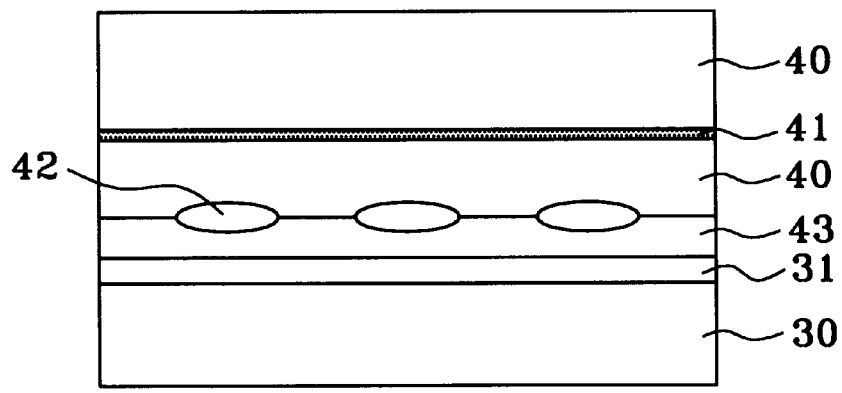

Referring to FIG. 2C, the first silicon substrate 30 and the second silicon substrate 40 are cleaned with a solution that the volume ratio of $NH_4OH:H_2O_2:H_2O$ is 1:4:20, or with a solution that the volume ratio of $H_2SO_4:H_2O$ is 4:1. Herein, those substrates also can be cleaned by both solutions in sequence. By doing so, particles on the first and the second silicon substrates 30 and 40 are removed and the surfaces thereof have hydrophilic property. This cleaning process is an essential process to be performed for bonding substrates.

Afterwards, the first silicon substrate 30 and the second silicon substrate 40 are bonded under a vacuum condition of $7.5 \times 10^{-1}$ Torr~$7.5 \times 10^{-4}$ Torr. Herein, the first silicon substrate 30 and the second silicon substrate 40 are bonded to contact the first oxide film 31 and the second oxide film 43 with each other. The bonded two silicon substrates are heat-treated at temperature of 800~1,200° C. for 30~120 minutes under the atmosphere of nitrogen $N_2$ or oxygen $O_2$, so that their bonding intensity increases.

Figure 2D:
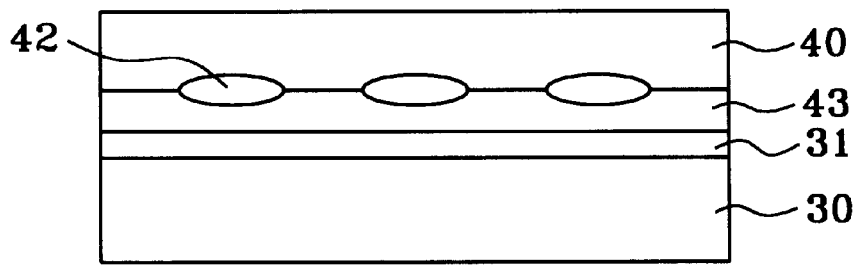

Referring to FIG. 2D, the second silicon substrate 40 is firstly polished to the portion adjacent to the first ion implantation layer according to a CMP process, and then wet-etched with an etching solution that the volume ratio of $NH_4OH:H_2O_2:H_2O$ is 1~2:0.01~0.02:1~5 to expose the ion implantation layer. Herein, the etching process of the second silicon layer 40 finishes when the first ion implantation layer is completely exposed since the first ion implantation layer 41 acts as an etching stopper. Therefore, the second silicon layer 40 has a uniform thickness with the first ion implantation layer 41. In the mean time, it is also available to use KOH instead of the $NH_4OH$. Next, the ion implantation layer is removed by secondly polishing in accordance with the CMP process.

Herein, the first and the second polishing processes are performed under the condition that the rotating velocity of chuck table is 10~30 rpm, the pressure applied by spindle is 4~8 psi, and the rotating velocity of the spindle is 20~40 rpm.

Figure 2E:
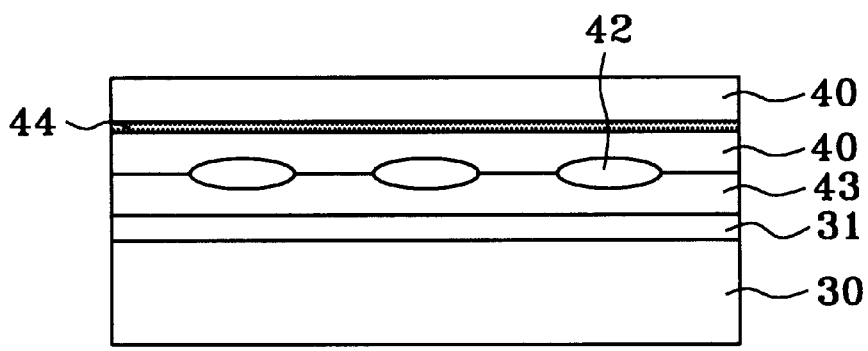

Referring to FIG. 2E, a second ion implantation layer 44 is formed in a selected depth of the second silicon substrate 40 by injecting hydrogen ions with energy of 10~1,000 KeV and dose of $1.0 \times 10^{15}/cm^2$~$1.0 \times 10^{17}/cm^2$. The second ion implantation layer 44 shown in FIG. 2E is formed near the first field oxide film 42 not to contact therewith.

Figure 2F:
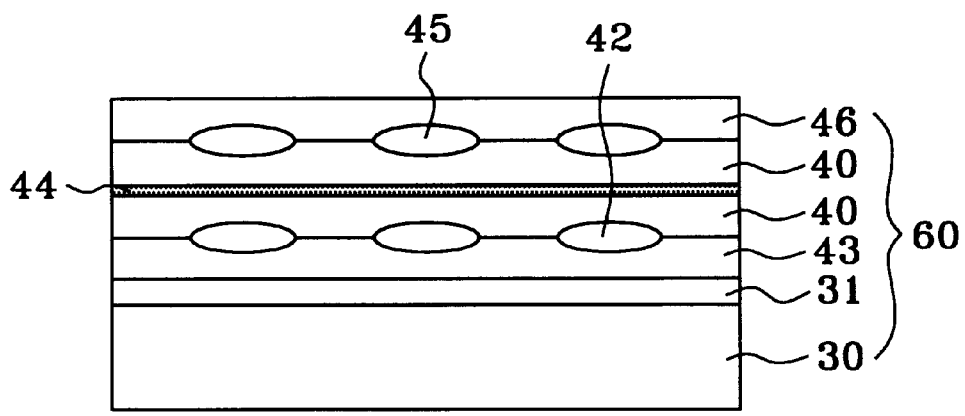

Referring to FIG. 2F, a second field oxide film 45 is formed on the other side of the second silicon substrate 40 by a partial oxidation process. The second field oxide 45 is formed with thickness of 500~5,000 Å and is apart from the second ion implantation layer 4 with same interval as the first field oxide film 42 is apart. A third oxide film 46 having even surface is formed on the other side of the second silicon substrate 40. The third oxide film 46 is a CVD oxide film selected from BPSG film, SOG film, $O_3$-TEOS oxide film and high density plasma oxide film. A wafer 60 is formed.

Figure 2G:
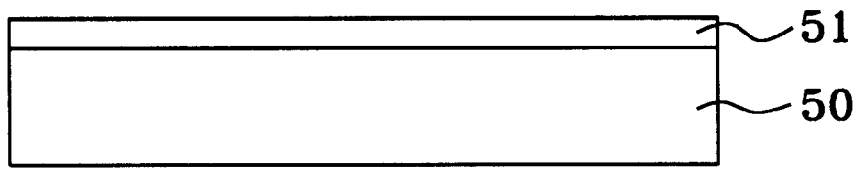

Referring to FIG. 2G, a third silicon substrate 50 being comprised of bulk silicon is provided. A fourth oxide film 51 with thickness of 500~10,000 Å is formed on the third silicon substrate 50 and is a thermal oxide film formed by a thermal oxidation process. The fourth oxide film 51 may be selected from BPSG film, SOG film, $O_3$-TEOS oxide film and high density plasma oxide film, instead of the thermal oxide film.

Figure 2H:
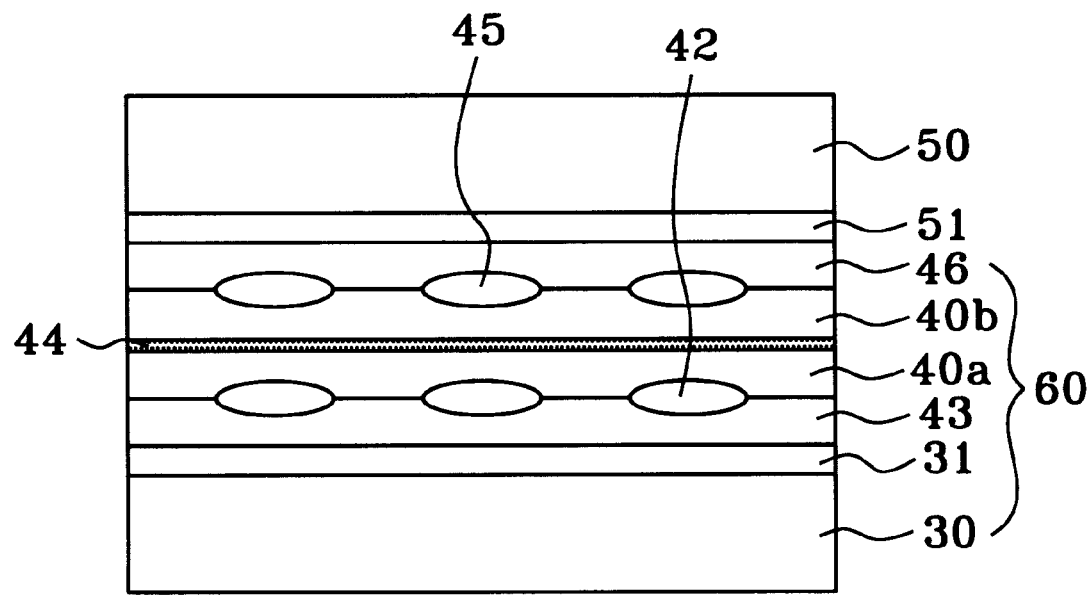

Referring to FIG. 2H, the wafer 60 and the third silicon substrate 50 having aforesaid structure as shown in FIG. 2G are cleaned with the above cleaning solution and their surfaces have hydrophilic property. They are bonded under a vacuum condition of $7.5 \times 10^{-1}$ Torr $7.5 \times 10^{-4}$ Torr so that the third oxide film 46 and the fourth oxide film 51 are contacted with each other.

Figure 2I:
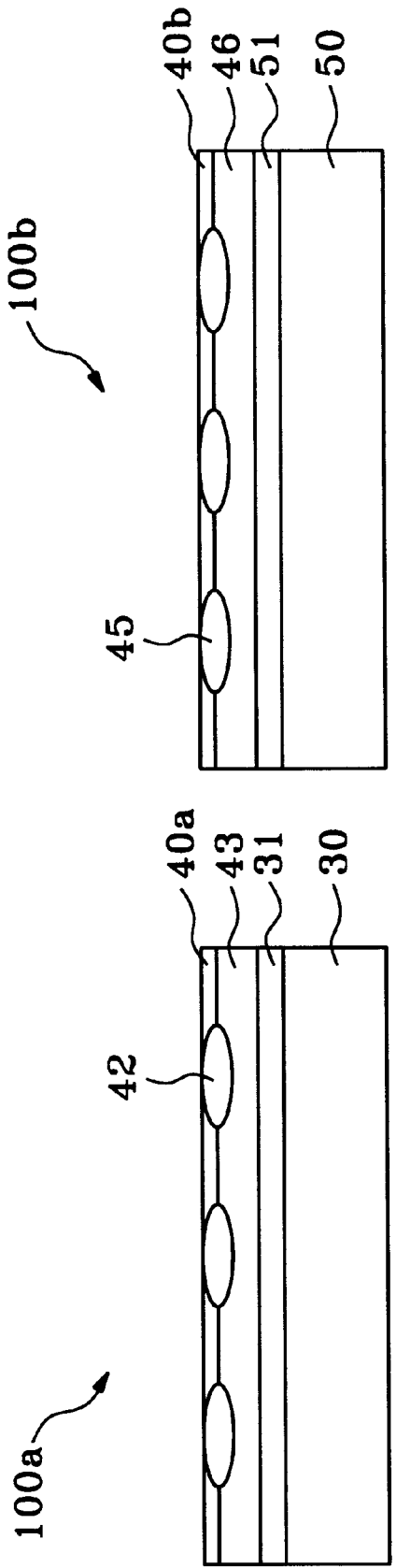

Referring to FIG. 2I, the bonded wafer 60 and the third silicon substrate 50 are heat-treated at temperature of 800~1,000° C. for 30~120 minutes under the atmosphere of nitrogen $N_2$ or oxygen $O_2$. Therefore their bonding intensity increases and simultaneously the first SOI wafer 100a and the second SOI wafer 100b are divided by the hydrogen ion layer as a boundary line. Herein, the first wafer 100a includes the first silicon substrate 30 and a first silicon layer 40a which is some portion of the second silicon substrate 40 where the first field oxide film 42 is formed, and the second SOI wafer 100b includes the third silicon substrate 50 and a second silicon layer 40b which is some portion of the second silicon substrate 40 where the second field oxide film 45 is formed.

Herein, the description to division of silicon layer where the second ion implantation layer is formed which is divided by the second ion implantation layer as a boundary line according to the heat treatment, will be omitted since it is a well-known mechanism to those skilled in the art.

Afterwards, a CMP process employing the first field oxide film 42 and the second field oxide film 45 as polishing stoppers is performed at the second silicon substrate 40 of those wafers 100a and 100b so as to maintain their uniform thickness and surface smoothness. The CMP process is performed under the condition that the rotating velocity of chuck table is 10~30 rpm, the pressure applied by spindle is 4~8 psi, and the rotating velocity of the spindle is 20~40 rpm.

Next, those wafers 100a and 100b processed under CMP are also heat-treated at temperature of 700~1,200° C. for 30~120 minutes under the atmosphere of hydrogen $H_2$ thereby fabricating two SOI wafers. The heat treatment under atmosphere of hydrogen $H_2$ is performed for completely removing the boron ions remained in the second silicon substrate where a device is to be formed, and for mending the crystalline defection of the second silicon substrate where a device is to be formed.

According to this embodiment of the present invention, the fabricating cost is remarkably reduced since two SOI wafers can be made out of three silicon substrates comparable to the conventional technology that one SOI wafer is made out of two silicon substrates.

While the present invention has been shown and described with respect to preferred embodiment using field oxide film as isolation film according to the partial oxidation method, an isolation film of trench type is also applicable to this invention.

Therefore, it will be understood by those skilled in the art that various changes in form and details may be made therein without departing from the spirit and the scope of the invention as defined by the following claims.

What is claimed is:

1. A method for fabricating silicon-on-insulator wafer, comprising the steps of:

provi ding a first, a second and a third silicon substrates being comprised of bulk silicon;

forming a first oxide film on one side of the first silicon substrate;

forming a first impurity layer within the second silicon substrate with a selected depth;

forming an isolation film in one side of the second silicon substrate;

forming a second oxide film having even surface on the second silicon substrate;

bonding the second oxide film of the second silicon substrate and the first oxide film of the first silicon substrate;

performing a first polishing, a wet-etching and a second polishing processes in sequence until the impurity layer is removed, in the other side of the second silicon substrate;

forming a second impurity layer within the second silicon substrate adjoining the first isolation film;

forming a second isolation film in the other side of the second silicon substrate;

forming a third oxide film having even surface on the other side of the second silicon substrate;

forming a fourth oxide film on the third silicon substrate;

bonding a fourth oxide film of the third silicon substrate and the third oxide film of the second silicon substrate;

dividing a first wafer and a second wafer by the second impurity layer as a boundary line, wherein the first wafer includes the first isolation film and a first silicon layer which is some portion of the second silicon substrate where the first isolation film is formed, and the second wafer includes the second isolation film and a second silicon layer which is some portion of the second silicon substrate where the second isolation film is formed; and polishing the first and the second silicon layers using the first and the second isolation films of the first wafer and the second wafer as a polishing stopper, respectively.

2. The method of claim 1, wherein the first and the fourth oxide films are thermal oxide films.

3. The method of claim 1, wherein any ones of BPSG film, SOG film, $O_3$-TEOS oxide film and high density plasma oxide film, is deposited as the first and the fourth oxide films.

4. The method of claim 1, wherein the first and the fourth oxide films are formed with thickness of 500~10,000 Å.

5. The method of claim 1, wherein the impurity layer is a boron ion-implanted layer.

6. The method of claim 5, wherein the impurity layer is formed by injecting boron ions with energy of 50~200 KeV and dose of $1.0 \times 10^{15}/cm^2$~$3.0 \times 10^{16}/cm^2$.

7. The method of claim 1, wherein the first and the second isolation films are formed with thickness of 500~5,000 Å by a partial oxidation process or by means of trench.

8. The method of claim 1, wherein the second and the third oxide films are any ones of BPSG film, SOG film, $O_3$-TEOS oxide film and high density plasma oxide film.

9. The method of claim 1, wherein the second and the third oxide films are formed with thickness of 1,000~10,000 Å.

10. The method of claim 1, wherein the first silicon substrate and the second silicon substrate are cleaned before they are bonded each other.

11. The method of claim 10, wherein the cleaning process is performed with one of a solution that the volume ratio of $NH_4OH:H_2O_2:H_2O$ is 1:4:20, or a solution that the volume ratio of $H_2SO_4:H_2O$ is 4:1.

12. The method of claim 1, wherein the first silicon substrate and the second silicon substrate are bonded under a vacuum condition of $7.5 \times 10^{-1}$ Torr $7.5 \times 10^{-4}$ Torr.

13. The method of claim 1, wherein the first substrate and the second silicon substrate are heat-treated at temperature of 800~1,200° C. for 30~120 minutes under the atmosphere of one of nitrogen $N_2$ or oxygen $O_2$ so that their bonding intensity increases, after bonding the first silicon substrate and the second silicon substrate.

14. The method of claim 1, wherein the second silicon substrate is wet-etched with an etching solution that the volume ratio of $NH_4OH:H_2O_2:H_2O$ is 1~2:0.01~0.02:1~5.

15. The method of claim 1, wherein the second impurity layer is formed by injecting hydrogen ions with energy of 10~1,000 KeV and dose of $1.0 \times 10^{15}/cm^2$~$1.0 \times 10^{17}/cm^2$.

16. The method of claim 1, wherein the second silicon substrate and the third silicon substrate are cleaned before they are bonded each other.

17. The method of claim 16, wherein the cleaning process is performed with one of a solution that the volume ratio of $NH_4OH:H_2O_2:H_2O$ is 1:4:20, or a solution that the volume ratio of $H_2SO_4:H_2O$ is 4:1.

18. The method of claim 1, wherein the process for dividing the first wafer and the second wafer is performed by heat-treating at temperature of 800~1,200° C. for 30~120 minutes under the atmosphere of one of nitrogen $N_2$ or oxygen $O_2$.

19. The method of claim 1, wherein the second silicon substrate is polished under the condition that the rotating velocity of chuck table is 10~30 rpm, the pressure applied by spindle is 4~8 psi, and the rotating velocity of the spindle is 20~40 rpm.

20. The method of claim 1, wherein the second silicon substrate of the first and the second wafers are polished, and those wafers are heat-treated at temperature of 700~1,200° C. for 30~120 minutes under the atmosphere of hydrogen $H_2$.

* * * * *